US006281830B1

(12) United States Patent
Flety

(10) Patent No.: US 6,281,830 B1
(45) Date of Patent: Aug. 28, 2001

(54) SYSTEM FOR ACQUIRING AND PROCESSING SIGNALS FOR CONTROLLING A DEVICE OR A PROCESS

(75) Inventor: Emmanuel Flety, Houilles (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/551,886

(22) Filed: Apr. 18, 2000

(30) Foreign Application Priority Data

Apr. 22, 1999 (FR) ........................................ 99-05151

(51) Int. Cl.[7] ........................................ H03M 1/38
(52) U.S. Cl. ........................................ 341/155
(58) Field of Search ........................................ 341/155, 159, 341/161

(56) References Cited

U.S. PATENT DOCUMENTS 4,748,887 6/1988 Marshall .
5,245,130 9/1993 Wheaton .
5,576,507 11/1996 LaMarra .
5,801,657 * 9/1998 Fowler ........................ 341/155
5,874,909 * 2/1999 Soenen ........................ 341/141

FOREIGN PATENT DOCUMENTS 0 281 214 A 9/1988 (EP) .
WO 92 09070 5/1992 (WO) .
WO 93 18504 A 9/1993 (WO) .

OTHER PUBLICATIONS

Anderson C.; "Keyboard Reports"; Keyboard, US; Miller Freeman Publications, San Francisco; vol. 23, No. 8, pp. 109–110, 112.

* cited by examiner

*Primary Examiner*—Brian Young
(74) *Attorney, Agent, or Firm*—Lawrence E. Laubscher, Sr.

(57) ABSTRACT

A system for acquiring and processing signals for controlling a device or a process has inputs receiving analog signals supplied by sensors and which are processed in order to send to the device control signals configured in accordance with a predetermined communication protocol. The system includes a screen and a keypad for accessing and modifying control signal configuration parameters. One application of the system is to controlling devices producing sound effects added to or applied to the sound of a musical instrument.

13 Claims, 2 Drawing Sheets

Figure 1:
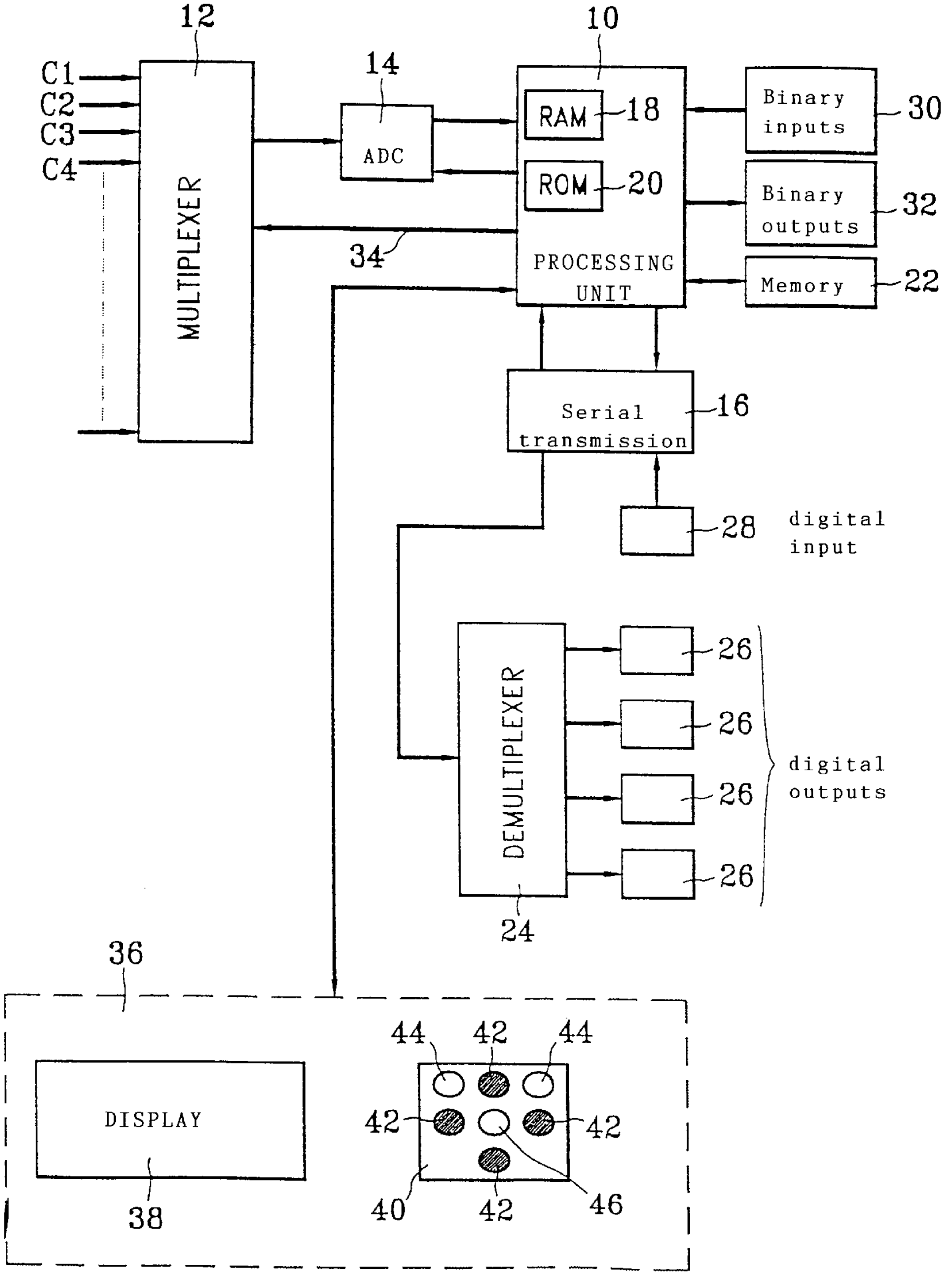

SYSTEM FOR ACQUIRING AND PROCESSING SIGNALS FOR CONTROLLING A DEVICE OR A PROCESS

BACKGROUND OF THE INVENTION

1. Field of the Invention

The invention relates to a system for acquiring and processing signals for controlling a device or a process, including data processing means, analog-to-digital conversion means for digitizing signals supplied by sensors, means for supplying the digitized signals to the data processing means, which generate control signals according to the digitized signals, in accordance with a particular communication protocol and having predetermined configurations, and means for transmitting the control signals to at least one device or process for application therein.

2. Description of the Prior Art

Analog signals supplied by sensors, for example pressure or force sensors, have been used in the prior art to control a device or a process, the signals produced by the sensors being digitized and converted into control signals in accordance with a particular communication protocol for transmission to the device or process to be controlled.

In particular, electronic music devices and instruments can be controlled by means of the MIDI (Musical Instrument Digital Interface) protocol published and updated by the MMA (Midi Manufacturers Association) (see for example the Internet site "Exploring Midi" of the School of Music of Northwestern University). This protocol enables information to be exchanged between devices such as synthesizers and an electronic device to be controlled by means of a keyboard, footpedals or the like, for example, whose actuation causes MIDI messages to be sent to the device, which generates sounds according to the messages received. The messages typically indicate the start and end of generation of a particular note, its volume, its modulation, a change of value of a controller, a change of program, a pressure per channel and a variation of height. Other MIDI messages can be used to transmit data, for example the result of analog-to-digital conversion of an analog input signal.

The object of the invention is to provide a system for acquiring and processing signals adapted to transmit control messages or signals of the aforementioned type, for example MIDI control messages or signals, enabling a user to modify the configuration of the control messages and signals and therefore to modify the operation of the device or the execution of the process controlled by the system.

OBJECT OF THE INVENTION

According to the invention, a system for acquiring and processing signals for controlling a device or a process, includes data processing means, analog-to-digital conversion means for digitizing signals supplied by sensors and applying the digitized signals to said data processing means, which generate, according to the digitized signals, control signals produced in accordance with a particular communication protocol and having predetermined configurations, and means for transmitting said control signals to a device or process for application therein, said system further including access means for accessing configuration parameters of said control signals, means for modifying said parameters and means for storing modified values of said parameters, corresponding to a new configuration of at least some of said control signals, wherein said access means include menus prestored in a memory of said system and displayable on said display means, means for selecting said menus and means for selecting selection fields and configuration fields in the said menus.

Generally speaking, the invention enables control messages or signals sent by the system to be configured dynamically and in real time in accordance with signals supplied by the sensors, the control messages or signals no longer being fixed in time and enabling the behavior of the control device or the execution of the controlled process to be changed in real time. The control signals can also be dynamically configured by a remote host system which has communication means compatible with those of the system according to the invention.

In one particular application of the invention the aforementioned control signals are configured in accordance with the MIDI protocol and are applied to one or more sound generators.

Alternatively, the control signals are applied to information processing means using graphical software, for example CAD software.

Figure 2:
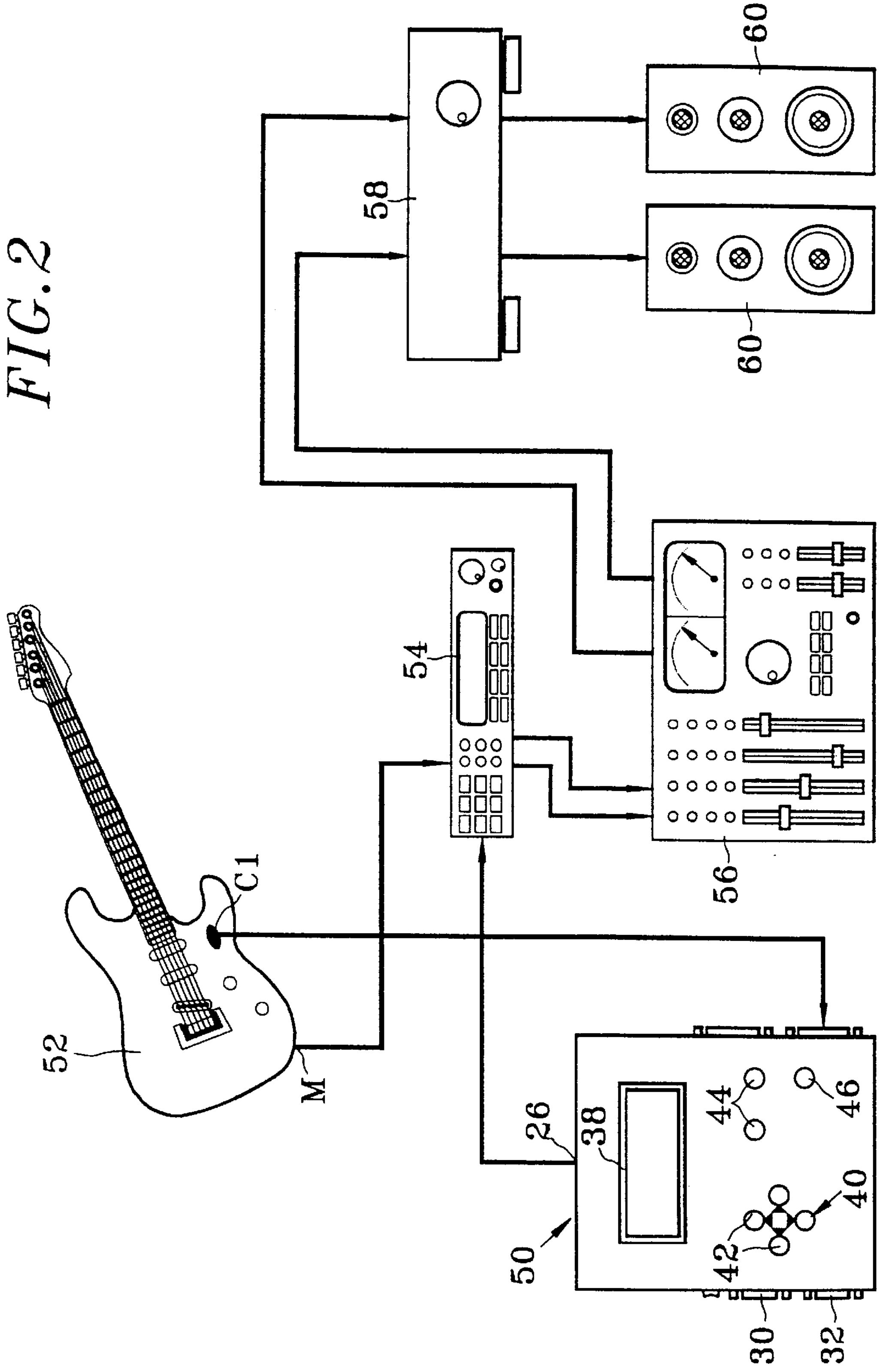

The invention will be better understood and other features, details and advantages of the invention will become more clearly apparent after reading the following description, which is given by way of example only and with reference to the accompanying drawings, in which:

FIG. 1 is a diagram showing the essential components of a system according to the invention, and FIG. 2 is a diagram showing the application of the system to controlling a sound generator from a musical instrument and in accordance with signals applied by a sensor.

DESCRIPTION OF THE PREFERRED EMBODIMENT

The system shown in FIG. 1 essentially comprises a data processor unit 10 with analog inputs which can be connected to sensors C1, C2, C3, etc., an analog multiplexer 12 and an analog-to-digital converter 14 connecting the inputs to processor means including a microprocessor or microcontroller, a serial data transmitter 16, a random access memory 18 for storing data, a read-only memory 20 for storing programs and a non-volatile memory 22 for storing configuration values selected by the user.

The transmitter 16 is connected by a demultiplexer 24 to serial digital outputs 26, of which there are four in the example shown. A serial digital input 28 is connected directly to the microprocessor of the processor unit 10, which has binary inputs 30 and binary outputs 32. A link 34 between the processor unit 10 and the multiplexer 12 enables the latter to be controlled by clock signals for time-division multiplexing the signals supplied by the sensors C1, C2, C3, etc.

The system according to the invention further includes a user interface 36 with a screen 38 and a keypad 40 connected to the processor unit 10 in the conventional way.

In one embodiment of the invention the screen 38 is a liquid crystal display with four lines each of 20 characters. The keypad 40 has four keys 42 for moving a cursor over the screen 38 (up, down, left and right), two keys 44 for increasing and decreasing parameter values and a validation key 46.

The analog inputs of the system which can be connected to the sensors C1, C2, C3, etc., of which there are 32, for example, are connected by the multiplexer 12 to the analog-to-digital converter 14 which, in this embodiment, is an 8-bit successive approximation converter. There are eight digital inputs 30, for example, and eight digital outputs 32. The non-volatile memory 22 stores 20 sets of configurations, each of which can be identified by a name.

Generally speaking, the processor unit 10 processes and analyzes analog signals supplied by the sensors, transmitted by the multiplexer 12 and digitized by the converter 14 and converts them into control messages or signals configured in accordance with a predetermined communication protocol, for example the MIDI protocol. The control signals are transmitted by the unit 16 and the demultiplexer 24 to the digital outputs 26, each of which can be connected to a device which uses the control messages or signals.

The interface 36 enables a user to modify the configuration of the control signals. The means providing access to the signal configuration parameters advantageously include menus displayed on the screen 38. The keys of the keypad 40 enable the user to select a menu, to select a configuration parameter from the selected menu, to modify its value and to validate the modified value. Modifications of configuration parameters by the user are applied immediately, in real time, to the control signals generated by the system. The set of parameters defining a control signal configuration can be stored in the memory 22 for subsequent re-use.

FIG. 2 shows one example of an application of the invention using a system 50 according to the invention, such as that shown in FIG. 1.

An analog input of the system 50 is connected to a sensor C1 mounted on a musical instrument 52 such as an electric guitar fitted with pick-ups M connected to an input of a sound generator 54 which is designed to receive MIDI control signals and to this end has an input connected to a serial digital output 26 of the system 50. The generator 54 is designed in particular to generate predetermined sound effects under the control of the sensor C1 and the system 50, which effects are applied to or added to the sounds produced by the instrument 52 or transform those sounds in a predetermined manner. Two audio outputs of the generator 54 are connected via a mixer 56 and an audio amplifier 58 to loudspeakers 60, for example.

In this example of an application of the system, the sensor C1 is actuated by the user and can be a pressure sensor whose resistance varies with the pressure applied to a sensitive surface of the sensor, which delivers an analog voltage signal proportional to the applied pressure. The pressure can be modulated by a finger of the guitarist, in particular if the sensor C1 is mounted on the scratch-plate of the guitar.

The output signal of the sensor C1 is processed by the system 50 according to the invention, which transmits a corresponding control message to the generator 54, in which the control signal modifies the output signals of the pick-ups of the guitar in accordance with a predetermined algorithm, for example to produce a particular sound effect. The output signals of the generator 54 are transmitted via the mixer 56 and the amplifier 58 to the loudspeakers 60 which reproduce this particular sound effect.

The sensors that can be connected to the analog inputs of the system 50 in this application are pressure sensors, breath sensors, muscular tension sensors, movement sensors or the like, for example. They provide a new gesture-driven controller for real-time control of sound production devices using data processing algorithms.

The digital inputs 30 of the system 50 can be connected to control systems such as footpedals, for example, which generate digital or binary signals (for example voltages of 0 volts and 5 volts, respectively). When used together, the four digital inputs 30 convert information coded in binary on eight bits into a MIDI signal. If the digital inputs 30 are used separately, the signal received by one of them operates dynamically on a configuration parameter of a MIDI signal associated with one of the aforementioned analog inputs.

The signals entering the system 50 can be displayed on the screen 38. Either one of the 32 analog inputs can be viewed or all the analog input signals can be viewed simultaneously, for example each on a small 7-segment VU meter enabling variations in each input signal to be displayed on a scale graduated from 1 to 7.

The digital outputs 32 of the system 50 deliver on/off signals for controlling systems whose operation is binary, for example lamps or light-emitting diodes.

The digital input 28 of the system according to the invention (see FIG. 1) enables it to receive MIDI control messages or signals from an external device, which signals are intended to change configuration parameters and to control the digital outputs.

The user interface of the system 50 is for modifying the configuration parameters of a number of MIDI messages, for example active note, active note plus polyphonic pressure, active note with trigger threshold, change of value of a controller, change of value of a controller with trigger threshold, change of program with trigger threshold, change of height, polyphonic pressure, pressure per channel, exclusive 7-bit message and exclusive 8-bit message. In the case of an active note message, the processed analog signal corresponds to an envelope changing with time and having a maximum. The processor unit 10 analyzes the envelope and identifies its maximum. When the maximum is reached, an active note MIDI message is generated. The velocity associated with the note is equal to the maximum of the envelope. The note number (defining the note) which is contained in the message can be varied by the user via the aforementioned interface 36.

The note emitted is maintained for as long as the analog signal envelope remains above a predetermined threshold. When the signal falls below the threshold, an inactive note MIDI message is sent to stop the generation of the note. The inactive note threshold is computed from the maximum of the envelope of the analog signal and can be adjusted by the user via the interface 36.

The foregoing explanations are applicable in principle to the configuration of other MIDI messages generated by the system according to the invention.

The menus prestored in the system according to the invention include, for example, and in addition to a welcome menu with loading, saving and selection fields, menus for configuring the analog and digital inputs of the system.

A first menu for configuring the analog inputs is for selecting the number or the name of a prestored set of values of parameters of all the analog inputs and all the digital inputs of the device and includes a field for selecting the analog input whose configuration is to be modified and fields for configuring parameters of a control signal generated according to the signal present at that analog input. For example, a first field is for deciding if the signal at the analog input concerned must be converted to a control signal or not. Another field is for selecting how the variations of the signal present at the analog input concerned are to be interpreted to generate the control signal, which can vary in the same direction as the signal at the analog input or in the opposite direction.

Another field is for determining the type of control signal that the system will generate in response to variations of the analog signal present at the selected input. In the case of MIDI messages, the system is capable of generating 11 different messages which are based on seven MIDI channel messages and on MIDI exclusive system messages, the seven channel messages being, for example: note depressed, note released, polyphonic pressure, change of value of a controller, change of program, pressure per channel and variation of height. The exclusive messages are for transmitting the result of analog-to-digital conversion of the signal on seven or eight bits.

Other fields are for adjusting the values of a control signal parameter, for example the fixed parameter of a MIDI message associated with an analog input, which parameter value can correspond to a MIDI note number, a MIDI controller number or a MIDI program number, depending on the type of MIDI message selected. Another field is for selecting the MIDI channel to which the MIDI message applies.

A second menu for configuring the analog inputs includes a field which is for selecting the number of a digital input controlling a parameter of the control signal, for example the fixed parameter of the MIDI message. Another field of the second menu is for adjusting the alternative value of the control signal parameter, for example the fixed parameter of a MIDI message. More than one analog input can be controlled by the same digital input, the digital control signal enabling transposition or reconfiguration of all the signals at the analog inputs concerned.

Another field of the second menu is for configuring parameter values such as a note velocity or a message control value with trigger threshold. An additional field is for configuring the trigger thresholds of these messages.

A third menu for configuring the analog inputs is for selecting a coefficient for scaling the value resulting from analog-to-digital conversion of the signal present at the selected analog input, which digital value can be used as such, if required. Another field is for selecting a positive or negative value which is added to the value resulting from analog-to-digital conversion. Another field of the third menu is for assigning a priority to the various active analog inputs by means of a refresh period corresponding to a number of cycles during which an input is not observed, a cycle corresponding to the acquisition of all of the active inputs. This configuration is particularly beneficial if an analog input receives a slow signal or a signal which is not to be acquired at high speed.

Another menu is for configuring the digital inputs and includes a field for selecting the digital inputs concerned. Another field is for determining the control signal associated with the digital inputs if they are used together or the variations of the digital inputs which are taken into account. Another field of this menu is for adjusting the values of the parameters of the associated control signals.

The invention can be applied to many other fields, for example the graphics field for controlling colors, brightness, positions and the like on a display screen; in this case, appropriate sensors, for example pressure and speed sensors, enable the user to change the characteristics of the images shown on the display screen.

What is claimed is:

1. A system for acquiring and processing signals for controlling a device or a process, said system including data processing means, analog-to-digital conversion means for digitizing signals supplied by sensors and applying the digitized signals to said data processing means, which generate, according to the digitized signals, control signals produced in accordance with a particular communication protocol and having predetermined configurations, and means for transmitting said control signals to a device or process for application therein, said system further including access means for accessing configuration parameters of said control signals, means for modifying said parameters and means for storing modified values of said parameters, corresponding to a new configuration of at least some of said control signals, wherein said access means include menus prestored in a memory of said system and displayable on said display means, means for selecting said menus and means for selecting selection fields and configuration fields in the said menus.

2. The system claimed in claim 1 wherein said access means include a keypad with a small number of keys, essentially for selecting, modifying and validating configuration parameters.

3. The system claimed in claim 1 wherein at least one of said sensors is in the form of a control device adapted to be actuated by a user.

4. A system as claimed in claim 1 including analog signal inputs connected to said sensors and digital signal inputs.

5. The system claimed in claim 4 wherein said prestored menus include at least a menu for configuring analog signal inputs and a menu for configuring digital signal inputs.

6. A system claimed in claim 5 including a first menu for configuring analog inputs including an analog input selection field and fields for configuring parameters of a control signal produced according to the analog signal at the selected input, a second analog input configuration menu including fields for selecting a digital input number for controlling a parameter of said control signal and fields for adjusting values of said parameter, and a third analog input configuration menu including fields for scaling a signal value resulting from analog-to-digital conversion, adjusting a value added to said signal value resulting from analog-to-digital conversion and adjusting a refresh period of said analog input.

7. The system claimed in claim 5 wherein said digital signal input configuration menu includes fields for acting on said inputs, selecting control signals associated with said inputs and setting parameter values of the control signals.

8. A system as claimed in claim 1 having at least one digital signal input, in particular for signals of the same type as said control signals.

9. A system as claimed in claim 1 including means for time-division multiplexing signals supplied by said sensors and for applying the multiplexed signals to said analog-to-digital conversion means.

10. The system claimed in claim 1 wherein said control signal outputs are serial outputs.

11. A system as claimed in claim 1 having digital outputs.

12. The system claimed in claim 1 wherein said control signals are configured in accordance with the MIDI communication protocol and are adapted to be applied to at least one sound generator.

13. The system claimed in claim 1 wherein said control signals are adapted to be applied to information processing means using graphical software and CAD software.

* * * * *